US006580148B2

(12) United States Patent
Hasegawa et al.

(10) Patent No.: US 6,580,148 B2

(45) Date of Patent: Jun. 17, 2003

(54) NONRECIPROCAL CIRCUIT DEVICE AND COMMUNICATION DEVICE USING SAME

(75) Inventors: Takashi Hasegawa, Kanazawa (JP); Katsuyuki Ohira, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/820,871

(22) Filed: Mar. 29, 2001

(65) Prior Publication Data

US 2002/0056902 A1 May 16, 2002

(30) Foreign Application Priority Data

Mar. 31, 2000 (JP) ....................................... 2000-099426

(51) Int. Cl.[7] ................................................ H01L 29/00

(52) U.S. Cl. ....................... 257/533; 257/698; 257/531; 257/528; 333/1.1; 333/24.2; 333/239; 174/52.1; 174/35 MS

(58) Field of Search ................................ 257/678, 698, 257/528, 531, 533, 275; 333/1.1, 24.2, 239; 174/52.1, 35 MS

(56) References Cited

U.S. PATENT DOCUMENTS 3,831,114 A * 8/1974 Paglione ..................... 333/1.1
5,159,294 A * 10/1992 Ishikawa et al. ............. 333/1.1

FOREIGN PATENT DOCUMENTS

JP 8-162806 A 6/1996
JP 08274511 A * 10/1996
JP 100098309 4/1998
JP 11068411 * 3/1999

* cited by examiner

*Primary Examiner*—Eddie Lee
*Assistant Examiner*—Chris C Chu
(74) *Attorney, Agent, or Firm*—Keating & Bennett, LLP

(57) ABSTRACT

An assembled magnetic body is provided with a ferrite and center electrodes coupled in a different direction from each other to the ferrite, and chip capacitors and a chip resistor are connected between the input/output port of each of the central conductors and a metal case. By forming a hole, in the vicinity of the terminals of the chip components to which input/output ports are connected, in the metal case, the occurrence of a solder ball is prevented and, if a solder ball is caused, the short-circuiting between the terminal electrode of a central conductor and the metal case is prevented.

12 Claims, 7 Drawing Sheets

NONRECIPROCAL CIRCUIT DEVICE AND COMMUNICATION DEVICE USING SAME

BACKGROUND OF THE INVENTION

1. Field of the Invention

This invention relates to a nonreciprocal circuit device such as an isolator, etc., used in a high-frequency bandwidth of a microwave band, etc., and a communication device using the device.

2. Description of the Related Art

Up to now, a lumped-constant-type circulator is constructed in such a way that a plurality of central conductors intersecting each other which are disposed in the vicinity of a ferrite plate and a magnet for applying a direct-current magnetic field to the ferrite plate are housed inside a case. Moreover, an isolator is constructed by connecting a fixed port out of three input/output ports in a circulator to a terminating resistor.

FIG. 12 is an exploded perspective view of a conventional isolator. Here, a box-shaped upper yoke 2 of a magnetic metal and a disk-shaped permanent magnet 3 disposed on the inner surface of the upper yoke 2 are shown. Moreover, an assembled magnetic body 5 is constructed in such a way that a disk-shaped ferrite 54 is placed in the joining portion of central conductors in the same shape as the bottom face of the ferrite 54, three central conductors extending from the above joining portion are bent and disposed so as to wrap the ferrite 54 with an angle of nearly 120 degrees to each other, and the input/output ports P1, P2, and P3 at respective ends of each of the central conductors are made to protrude outwards. Matching chip capacitors C1, C2, and C3 are connected between the input/output ports P1, P2, and P3 and a grounding electrode inside a resin case 7. A terminating chip resistor R is connected between an electrode conductive to the input/output port P3 and the grounding electrode. The resin case 7 is shown. A lower yoke 8*a* of a magnetic metal combined together with the upper yoke 2 constitutes a closed magnetic circuit. Several elements and parts in FIGS. 12–13B correspond to elements and parts described in connection with the first embodiment (FIGS. 1–4) and duplicative descriptions of those elements and parts are omitted.

FIG. 13A is a sectional view of a main part of the conventional isolator shown in FIG. 12. One terminal electrode of the chip resistor R is connected to the grounding terminal 73. To the other terminal electrode of this chip resistor R, the input/output port P3 is soldered. Moreover, the chip capacitor C3 is connected between the input/output port P3 and the grounding terminal 73.

In such a construction in which the terminal electrode of the chip resistor R used as a terminating resistor is insulated from a metal case 8 by the bottom portion 7*b* of the resin case, the bottom portion 7*b* of the resin case is required to be made 0.2 mm or more in thickness in order to ensure the fluidity of resin inside the molding die when injection molding is performed by using resin, and the condition is unfavorable for low-profile products to that extent.

Then, as shown in FIG. 13B, a construction in which the terminal electrode, that is, the portion to which the input/output port P3 of a center electrode is connected, of the chip resistor R is provided only on the opposite side to the metal case 8 and the other terminal electrode of the chip resistor R is directly soldered to the metal case, can be also adopted. Furthermore, as shown in FIG. 13C, also lower-profile products can be obtained by soldering the chip capacitor C3 directly to the metal case 8.

However, in such a construction in which the chip components are directly soldered to the metal case 8, when the soldering pasts coated on the terminal electrodes, etc., is melted, the melted solder is confined in a narrow space between the terminal electrode to which the input/output port of a center electrode is connected and the metal case 8, and then cases in which a ball-shaped solder B remains as shown in the drawings sometimes occur. If such a ball is caused, it is feared that the above terminal electrode and the metal case 8 may be short-circuited and that the electrode on the hot side of the chip capacitor C3 and the metal case may be short-circuited.

SUMMARY OF THE INVENTION

It is an object of the present invention to provide a nonreciprocal circuit device which may be made low-profile and in which short-circuiting by a solder ball can be prevented and a communication device using the device.

In the present invention, a nonreciprocal circuit device comprises a magnetic body to which a direct-current magnetic field is applied, a plurality of central conductors which are coupled in a different direction to the magnetic body with each other, and chip components connected between the input/output port of each of the central conductors and a metal case, wherein a hole is formed in the metal case at a position which is located in the proximity of the terminals of the chip component to which the input/output ports are connected. Because of such a configuration, the connection portion of the input/output port of the chip component is made open by the hole and the possibility of a solder ball remaining therein is made very rare, and thus the occurrence of a defect such that the terminal electrode of the chip component or the input/output port of a central conductor is short-circuited to the metal case via solder ball is prevented.

Moreover, in the present invention, an insulating material is filled or inserted in the hole. In this way, the terminal portion of a chip component is prevented from loosening in the hole portion and the whole bottom portion of the chip component is made in contact with the insulating material filled in the hole and the metal case to stabilize the chip component. Moreover, the inside of the metal case is sealed to improve the reliability of the nonreciprocal circuit device.

Moreover, in the present invention, the above insulating material constitutes a part of a resin case containing the chip components, etc. In this way, the total number of parts is reduced and cost reduction is achieved.

Moreover, in the present invention, the opening in the external surface of the metal case is narrower than the opening in the inner surface thereof. Because of such a construction, a space which is to be insulated from the metal case and which is located in the vicinity of the terminal electrode of a chip component is widened. The opening area toward the outside of the metal case is reduced, and accordingly the environmental resistance is enhanced.

Moreover, in the present invention, the chip component has a substantially parallelepiped shape, terminal electrodes are formed on opposing sides in the longitudinal direction or the transversal direction of the chip component, one terminal electrode is connected to the metal case and the other terminal electrode is formed only on the opposite side to the metal case. According to this construction, a distance between the terminal electrode on the hot side and the metal case is increased, the terminal electrode on the hot side is the terminal electrode of a chip component which is located opposite to the side to be connected to the metal case. Accordingly the possibility of short-circuiting is more surely avoided and the reliability can be further increased.

Furthermore, in the present invention, a communication device is constructed by using a nonreciprocal circuit device having any of the above construction.

DESCRIPTION OF THE PREFERRED EMBODIMENTS

The construction of an isolator according to a first embodiment is described with reference to FIGS. 1 to 4.

Figure 1:
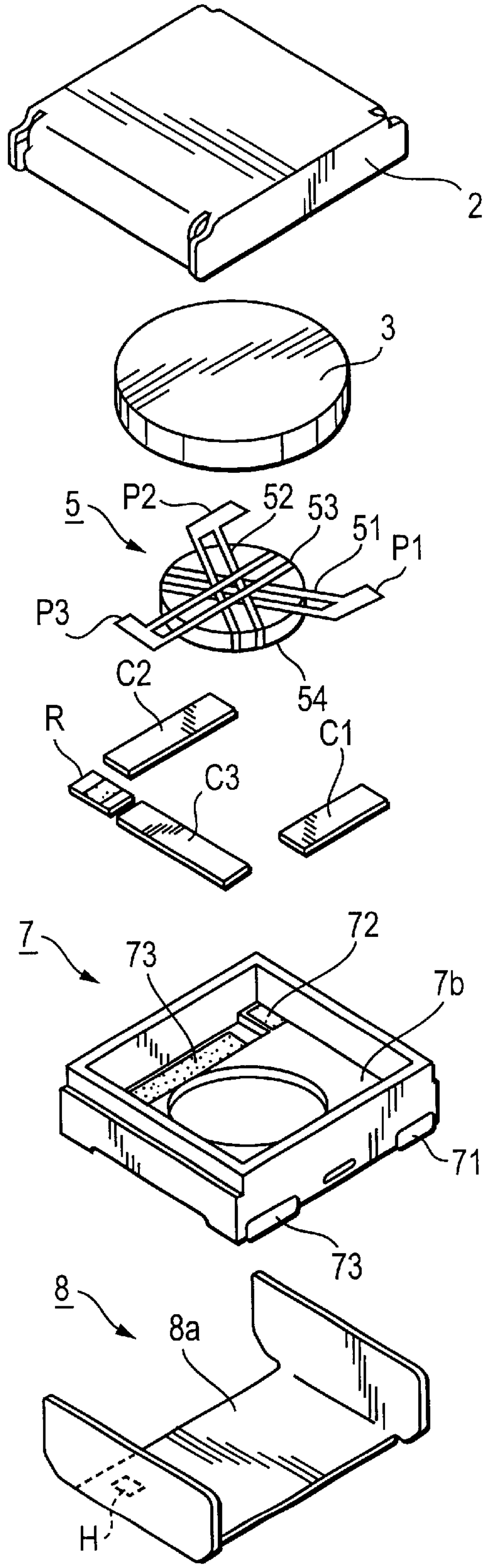
FIG. 1 is an exploded perspective view of an isolator according to a first embodiment.
Figure 2:
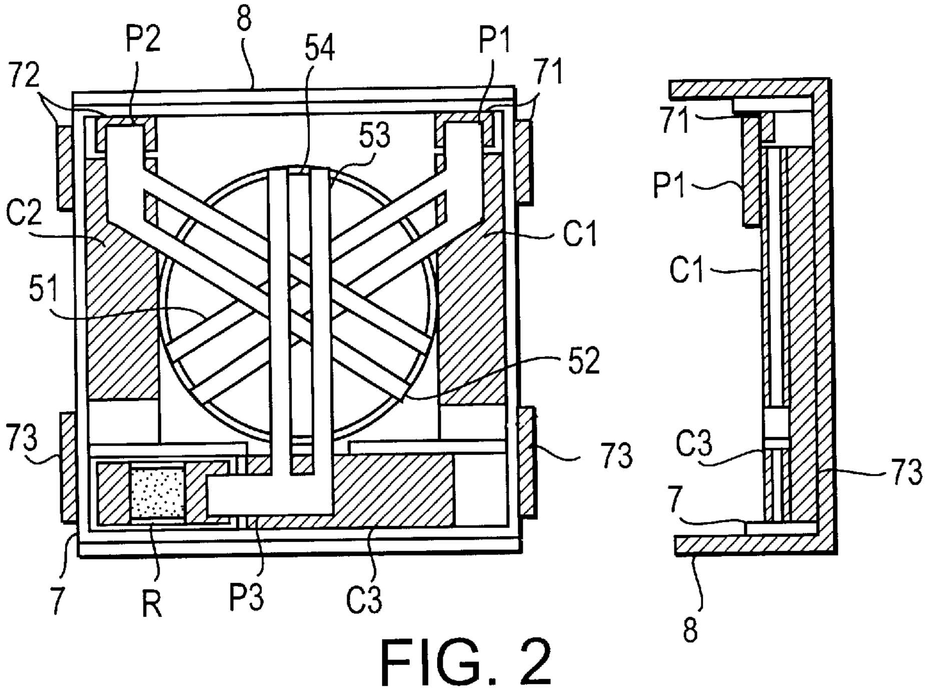
FIG. 2 is a top view and sectional side view of the isolator in FIG. 1 in which an upper yoke is removed.

FIG. 1 is an exploded perspective view of an isolator and FIG. 2 is a top view and sectional side view of the isolator with an upper yoke 2 removed. Here, a box-shaped upper yoke 2 of a magnetic metal and a disk-shaped permanent magnet 3 arranged on the inner surface of the upper yoke 2 are shown. An assembled magnetic part 5 is also shown as follows. A ferrite 54 is placed in the connected portion of central conductors which has substantially the same shape as the bottom surface of the ferrite 54. Three central conductors 51, 52, and 53 extended from the above-mentioned connected portion are arranged by bending the conductors having insulating sheets (not illustrated) therebetween with an angle of substantially 120 degrees to each other so as to wrap the ferrite 54. The input/output ports P1, P2, and P3 on the tip side of the central conductors 51, 52, and 53 are protruded outward. A resin case 7 containing the above assembled magnetic part and the following chip components is shown, and a grounding terminal a part of which is exposed on the inner upper surface of the resin case 7, an input/output terminal 72 which is exposed from the bottom face to the side face, a grounding terminal 73, etc., are arranged in the resin case 7 by insert molding. Matching chip capacitors C1, C2, and C3 are connected between the input/output ports P1, P2, and P3 and the grounding electrode inside the resin case 7. A terminating chip resistor R is also connected between an electrode conductive to the input/output port P3 and the grounding electrode. A lower yoke 8*a* made of a magnetic body is shown, and the lower yoke 8*a* combined with the upper yoke 2 constitutes a closed magnetic circuit. In this way, a magnetic field produced by the permanent magnet 3 is applied to the ferrite 54 in its thickness direction.

The metal case 8 separated from the resin case 7 is depicted in FIG. 1. This metal case 8 may be constructed as a different one from the resin case 7 and also the resin case 7 may also be integrally molded with the metal case 8 by insert molding.

Figure 3:
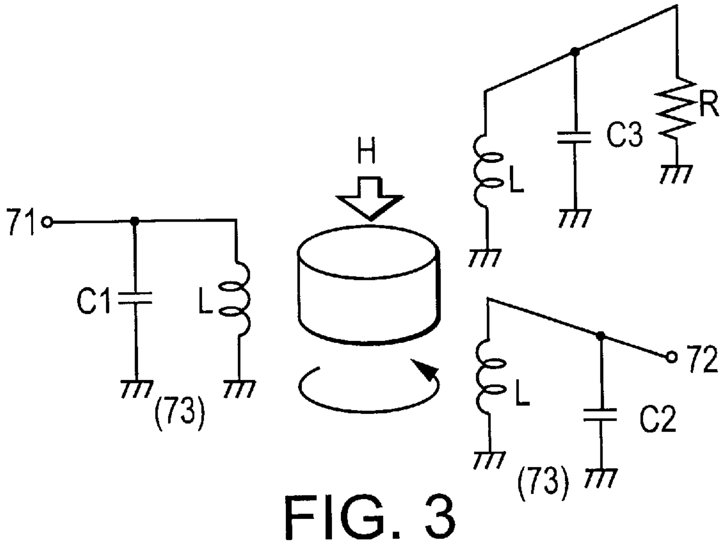
FIG. 3 an equivalent circuit diagram of the isolator in FIG. 1.

FIG. 3 is an equivalent circuit diagram of the above isolator. In this drawing, a direct-current magnetic field is represented by H and the central conductors 51, 52, and 53 are represented as an equivalent inductor L. Because of such a circuit construction, a signal input from an input/output terminal 71 as a forward input terminal is output from an input/output terminal 72 as a forward output terminal with EL low insertion loss, and an incident signal to the input/output terminal 72 is dissipated by the resistor R and the signal is scarcely output from the input/output terminal 71.

Figure 4:
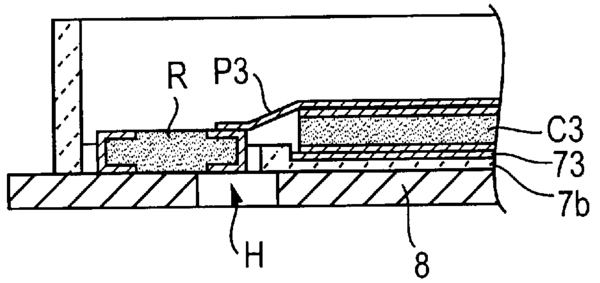
FIG. 4 is a partial sectional view of a main part of the isolator in FIG. 1.

FIG. 4 is a partial sectional view on line passing through the chip resistor R and chip capacitor C3 of the above isolator. A hole H provided in a part of the metal case 8 is located at the hot terminal electrode of the chip resistor R in FIG. 4. Moreover, the bottom portion of the resin case is integrally molded with a portion 73 shown. The lower electrode, on the grounding side, of the chip capacitor C3 is soldered to the grounding terminal 73. Moreover, the input/output port P3 of one central conductor is soldered to the hot terminal electrode of the chip resistor R and the hot terminal electrode of the chip capacitor C3, respectively. Moreover, the grounding-side terminal electrode of the chip resistor R is directly soldered to the metal case 8.

The soldering of each of the above takes place in such a way that each of the locations to be soldered is coated in advance with soldering paste(cream solder), a chip resistor R is temporarily fixed at a predetermined location of the metal case 8, a chip capacitor C3 at a predetermined location of the grounding terminal 73, and further the input/output port P3 of a central conductor at a predetermined location, and then the whole is heated to melt the above soldering paste and soldered to be fixed. At this time, since the space located in the terminal electrode on the hot side of the chip resistor R is made open by the hole H, the melted solder is not confined in a narrow space and the generation of a solder ball is prevented. Moreover, the terminal electrode on the hot side of the chip resistor R and the metal case 8 are electrically insulated from each other by the hole H, and accordingly even if a solder ball is caused and the solder ball sticks to the terminal electrode on the hot side of the chip resistor R, the terminal electrode on the hot side of the chip resistor R or the input/output port P3 of a central conductor is not short-circuited to the metal case 8 via the solder ball.

Figure 13A:
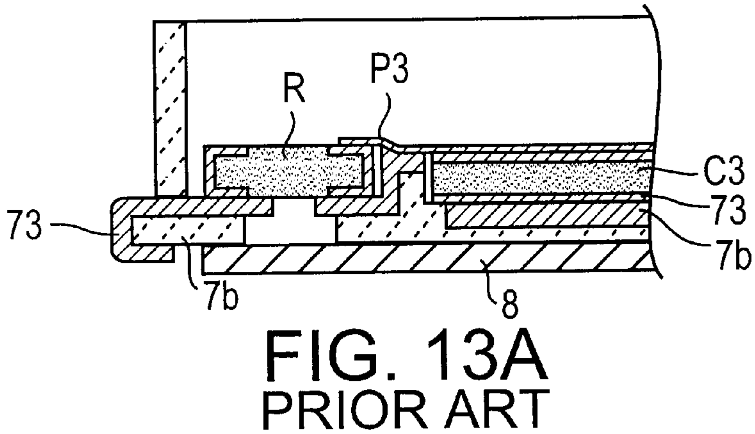
FIG. 13A PRIOR ART
FIGS. 13A, 13B, and 13C are partial sectional views of conventional isolators of three types.

In FIGS. 4 and 13, when the thickness of each is set such that the resin case is 0.2 mm thick, the grounding terminal (electrode) 73 is 0.1 mm thick, the chip capacitor C3 is 0.2 mm thick, the chip resistor R is 0.35 mm thick, then, in the conventional construction shown in FIG. 13A, the distance from the surface of the metal case with which the resin case is in contact to the upper surface of the chip resistor R is 0.65 mm. On the other hand, in the example shown in FIG. 4, the upper surface of the chip resistor R is made lower than the upper surface of the chip capacitor C3, and accordingly the distance from the surface of the metal case with which the resin case is in contact to the upper surface of the chip capacitor C3 becomes 0.5 mm to reduce the height of the isolator.

Figure 5A:
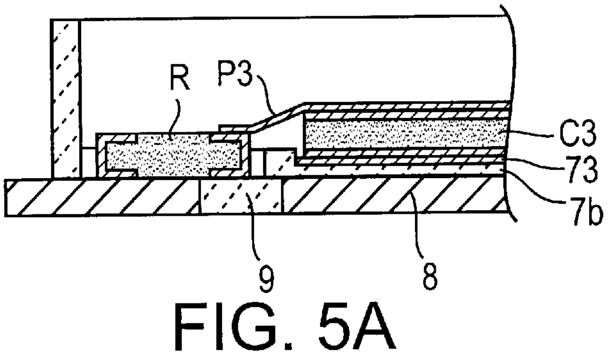
FIGS. 5A and 5B are partial sectional views of a main part of an isolator according to a second embodiment.
Figure 5B:
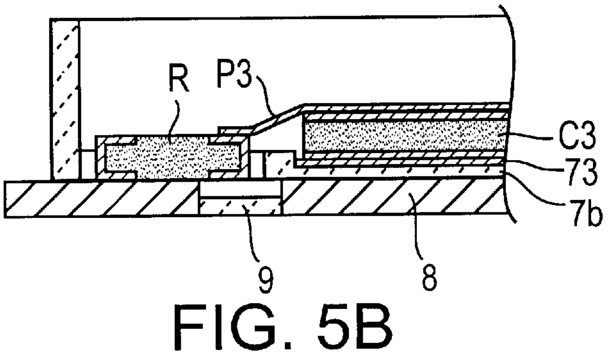

Next, partial sectional views of a main part of an isolator according to a second embodiment are shown in FIGS. 5*a* and 5B. As shown in FIG. 5A, the hole H shown in FIG. 4 is filled with an insulating resin 9. Moreover, in the example shown in FIG. 5B, an insulating resin 9 is inserted in the above-mentioned hole H. According to the construction shown in FIG. 5A, the whole bottom surface of the chip resistor R is in contact with a flat surface, the mounting state is stabilized, and the reliability increases. Moreover, in either of the examples in FIG. 5A and FIG. 5B, as the hole in the metal case is not left open, dust does not enter the inside of the isolator from the hole and accordingly a high environmental resistance can be realized.

Figure 6A:
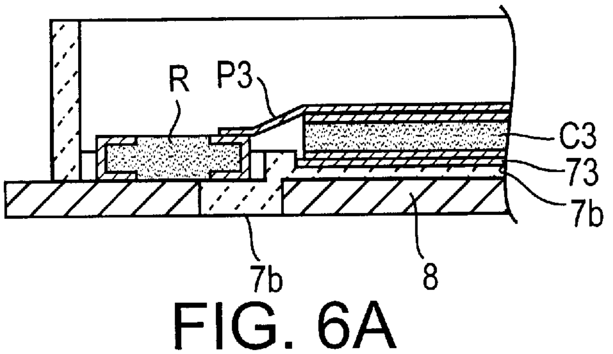
FIGS. 6A and 6B are partial sectional views of a main part of an isolator according to a third embodiment.
Figure 6B:
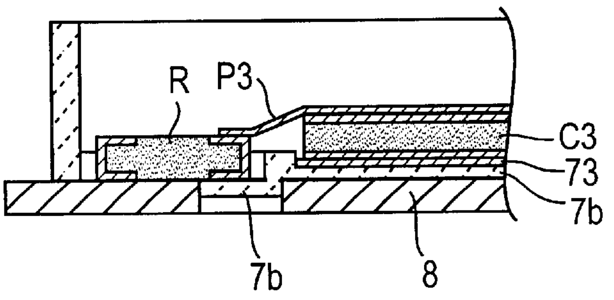

Next, partial sectional views of a main part of an isolator according to a third embodiment are shown in FIGS. 6A and 6B. As shown in FIG. 6A, a metal case 8 and a resin case are combined integrally by insert molding and a hole with which the metal case 8 is provided is filled with the resin of a bottom 7*b* of the resin cafe. Moreover, in the example shown in FIG. 6B, the hole is constructed so as to be closed by the bottom 7*b* of the resin case without filling the hole completely. But either of them increases the stability of the mounted chip resistor R and, even if a solder ball sticks to the terminal electrode on the hot side of the resistor, the electrical conduction between the solder ball and the metal case 8 is prevented and the short-circuit of the terminal electrode on the hot side of the chip resistor R to the metal case 8 can be prevented.

Moreover, a material to be inserted or filled in the above hole H is not limited to resin, but other electrical insulators may be used.

Figure 7:
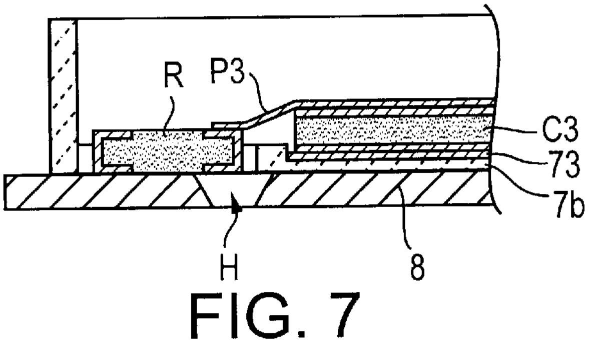
FIG. 7 is a partial sectional view of a main part of an isolator according to a fourth embodiment.

Next, a partial sectional view of a main part of an isolator according to a fourth embodiment is shown in FIG. 7. The opening, in the external surface of a metal case 8, of a hole H with which the metal case is provided is made narrower than the opening in the inner surface. Because of this configuration, the terminal electrode on the hot side of a chip resistor R is securely insulated from the metal case 8 and the reduction of the effective sectional area of a magnetic path is minimized, and, as a result, the increase of the magnetic reluctance is prevented and the deterioration of the magnetic circuit can be minimized. Moreover, as the opening area toward the outside of the hole H which is provided with the metal case 8 is reduced, the electromagnetic shielding effect of the metal case 8 is not deteriorated and the environmental resistance to dust, etc., can be increased.

Moreover, not only the opening, in the external surface of the metal case 8, of the hole H which is provided in the metal case is simply made narrower than the opening in the inner surface, but also the shape of both openings may be made different from each other. For example, the opening in the external surface of the metal case is made of a square and the opening in the inner surface may be made rectangular.

Moreover, the construction in which the opening in the external surface of the metal case is made different in shape from the opening in the inner surface may be applied to the cases where the hole is provided with an insulator as shown in FIGS. 5A, 5B, 6A, and 6B.

Figure 8:
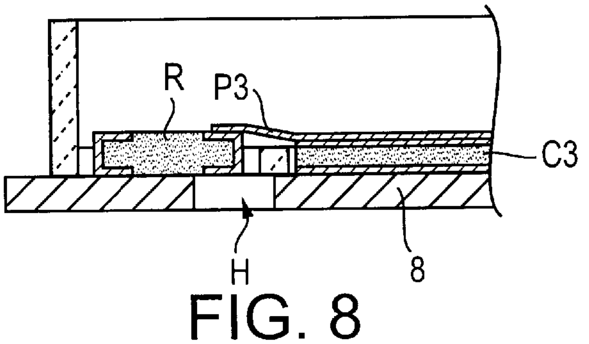
FIG. 8 is a partial sectional view of a main part of an isolator according to a fifth embodiment.

Next, a partial sectional view of a main part of an isolator according to a fifth embodiment is shown in FIG. 8. A chip capacitor C3 for matching is directly soldered to the inner surface of a metal case 8. In such a construction, by providing a hole H which insulates the terminal electrode on the hot side of a chip resistor R from the metal case 8, the occurrence of a solder ball is suppressed, and even if the solder ball is produced, the short-circuit of the terminal electrode on the hot side of the chip resistor R to the metal case 8 can be securely prevented.

Also in such a construction in which a chip capacitor C3 for matching is directly soldered to the inner surface of the metal case 8, the construction in which the hole is provided with an insulator may be applied as shown in FIGS. 5A, 5B, 6A, and 6B. Similarly, a construction in which the opening in the external surface of a metal case is made different in shape from the opening in the inner surface as shown in FIG. 7, may be applied.

Figure 9:
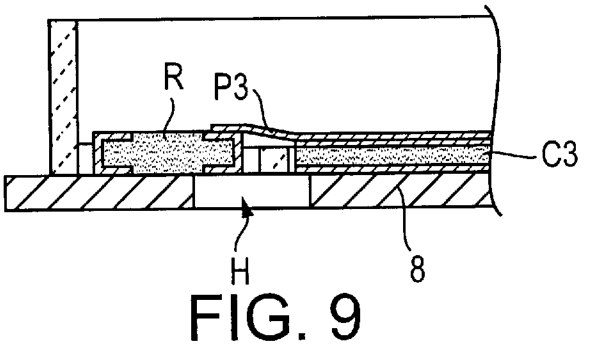
FIG. 9 is a partial sectional view of a main part of an isolator according to a sixth embodiment.

Next, a partial sectional view of a main part of an isolator according to a sixth embodiment is shown in FIG. 9. A hole H which insulates the terminal electrode on the hot side of a chip resistor R from a metal case is provided and the hole H is enlarged to the vicinity of the connection portion between the input/output port P3 of a central conductor and a chip capacitor C3. Because of such a construction, the occurrence of a solder ball is suppressed between the terminal electrode (upper electrode) on the hot side of the chip capacitor C3 and the metal case 8 is also suppressed, and even if a solder ball is caused, the short-circuit between the terminal electrode on the hot side of the chip resistor R or the input/output port P3 and the metal case 8 by the solder ball is prevented.

Moreover, in such a construction in which the hole H is enlarged to the vicinity of the connection portion between the input/output port P3 of a central conductor and the chip capacitor P3, the hole may be provided with an insulator as shown in FIGS. 5A, 5B, 6A, and 6B.

Figure 10:
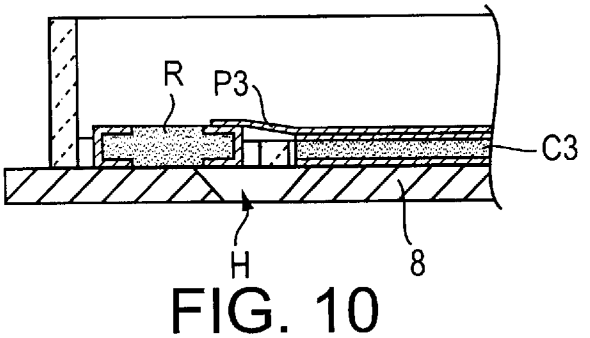
FIG. 10 is a partial sectional view of a main part of an isolator according to a seventh embodiment.

Next, a sectional view of a main part of an isolator according to a seventh embodiment is shown in FIG. 10. A metal case 10 is provided with a hole H which is made open over the whole connection portion of the input/output port P3 of a central conductor to the terminal electrode on the hot side of a chip resistor R and the terminal electrode on the hot side of a chip capacitor C3, and the opening area in the external surface of the hole H is reduced. Because of this construction, the terminal electrode on the hot side of the chip resistor R is securely insulated from the metal case 8, and the reduction of the effective sectional area of a magnetic path is minimized, and accordingly the increase of the magnetic reluctance is prevented and the deterioration of the magnetic circuit is minimized. Moreover, the opening area, toward the outside, of the hole which is provided in the metal case 8 is reduced, and then, without deteriorating the electromagnetic shielding effect of the metal case 8, an environmental resistance to dust, etc., can be also increased.

Figure 13B:
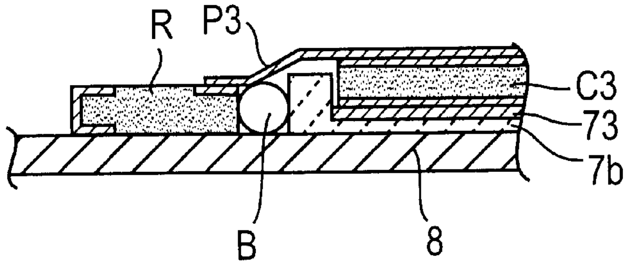
FIG. 13B PRIOR ART
Figure 13C:
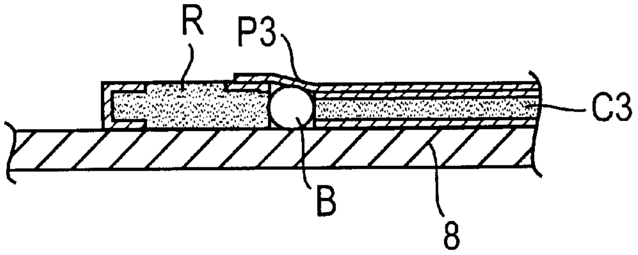
FIG. 13C PRIOR ART

In each of the embodiments shown in the above, a chip resistor the terminal electrode of which is formed so as to extend from the upper surface to the lower surface through the side face was used, but, as shown in FIGS. 13B and 13C, the terminal electrode may be formed only on the upper surface. According to this construction, a distance between the terminal electrode of a chip component, opposite to the side connected to a metal case, that is, the terminal electrode on the hot side and the metal case is increased, and accordingly the possibility of short-circuiting by a solder ball is more surely avoided and the reliability can be further increased.

In each of the embodiments shown in the above, a chip resistor and a single-plate chip capacitor were taken as examples of a chip component, but any chip component can be used in the same way if terminal electrodes are formed on the upper and lower surfaces of the chip component. For example, when chip inductors (chip coils) and chip capacitors of lamination type are used, they can be applied in the same way.

Moreover, in each of the embodiments, a three input/output port type isolator was taken as an example, but the same thing can be applicable to a two input/output port type nonreciprocal circuit element in which two central conductors are coupled to the magnetic body.

Moreover, in the examples shown in FIGS. 1 to 3, etc., a disk-shaped ferrite was used, but a ferrite in the form of a square and another polygon may be used.

Figure 11:
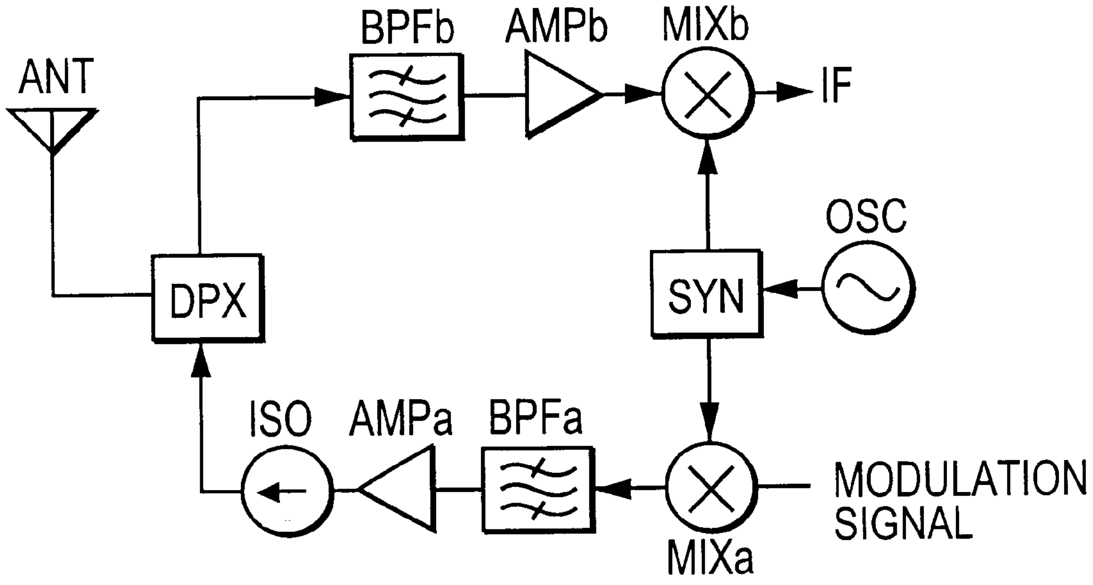
FIG. 11 is a block diagram showing the construction of a communication device according to an eighth embodiment.
Figure 12:
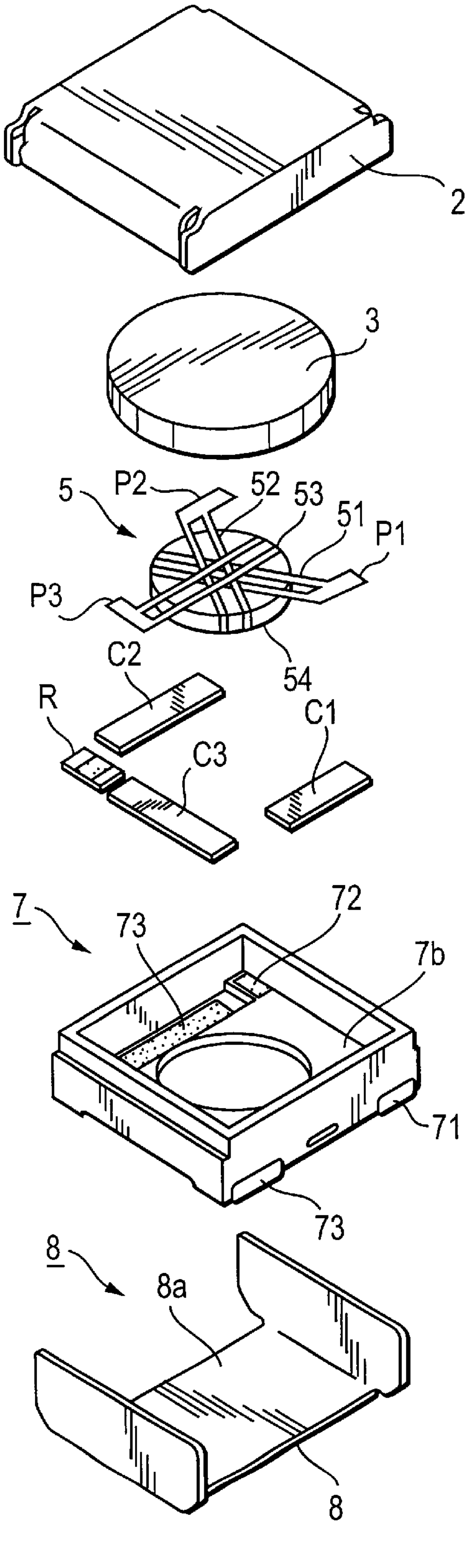
FIG. 12 PRIOR ART
FIG. 12 is an exploded perspective view showing the construction of a conventional isolator.

Next, an example of a communication device using the above isolator is described with reference to FIG. 11. In the drawing, a transmitter-receiver antenna ANT, a duplexer DPX, bandpass filters BPFa and BPFb, amplifiers AMPa and AMPb, mixers MIXa and MIXb, an oscillator OSC, and a frequency synthesizer SYN are shown. The mixer MIXa modulates a frequency signal output from the frequency synthesizer SYN by a modulation signal, the bandpass filter BPFa makes only the bandwidth of transmission signals pass through, the amplifier AMPa power amplifies and transmits this from the antenna ANT through an isolator ISO and the duplexer DPX. The bandpass filter BPFb makes only a reception frequency band out of the signals output from the duplexer DPX pass through and the amplifier AMPb amplifies the reception signal. The mixer MIXb mixes the frequency signal output from the frequency synthesizer SYN and the reception signal to output an intermediate-frequency signal IF. In the communication device having such a construction, any of the devices shown in FIGS. 1 to 10 is used as the above isolator ISO.

What is claimed is:

1. A nonreciprocal circuit device comprising:

a magnetic body arranged for receiving a direct-current magnetic field;

a plurality of central conductors which are coupled to the magnetic body and arranged in different respective directions with respect to the magnetic body; and chip components each connected between a respective input/output port of a corresponding one of the central conductors and a metal case;

wherein a hole is formed in the metal case at a position which is located in proximity to a terminal of one of the chip components to which the corresponding input/output port is connected; and said hole is spaced from all edges of the metal case.

2. A nonreciprocal circuit device as claimed in claim 1 wherein the hole is filled partly or entirely with an insulating material.

3. A nonreciprocal circuit device as claimed in claim 2, wherein the insulating material constitutes a part of a resin case containing the chip component.

4. A nonreciprocal circuit device as claimed in any one of claims 1 to 3, wherein the hole has an opening in an external surface of the metal case which is narrower than an opening of said hole in the inner surface of the metal case.

5. A nonreciprocal circuit device as claimed in any one of claims 1 to 3, wherein the chip component has a substantially parallelepiped shape, terminal electrodes are formed on opposing sides in a longitudinal direction or a transversal direction of the chip component, one terminal electrode is electrically connected to the metal case, and another terminal electrode is formed only on a side of said chip component opposite to the metal case.

6. A communication device comprising a nonreciprocal circuit device as claimed in claim 1.

7. A nonreciprocal circuit device comprising:

a magnetic body arranged for receiving a direct-current magnetic field;

a plurality of central conductors which are coupled to the magnetic body and arranged in different respective directions with respect to the magnetic body; and a chip component connected between a respective input/output port of a corresponding one of the central conductors and a metal case;

wherein a hole is formed in the metal case at a position which is located in proximity to a terminal of said chip component to which said respective input/output port is connected; and said hole is spaced from all edges of the metal case.

8. A nonreciprocal circuit device as claimed in claim 7, wherein the hole is filled partly or entirely with an insulating material.

9. A nonreciprocal circuit device as claimed in claim 8, wherein the insulating material constitutes a part of a resin case containing the chip component.

10. A nonreciprocal circuit device as claimed in any one of claims 7 to 9, wherein the hole has an opening in an external surface of the metal case which is narrower than an opening of said hole in the inner surface of the metal case.

11. A nonreciprocal circuit device as claimed in any one of claims 7 to 9, wherein the chip component has a substantially parallelepiped shape, terminal electrodes are formed on opposing sides in a longitudinal direction or a transversal direction of the chip component, one terminal electrode is electrically connected to the metal case, and another terminal electrode is formed only on a side of said chip component opposite to the metal case.

12. A communication device comprising a nonreciprocal circuit device as claimed in claim 7.

* * * * *